(12) United States Patent
Phu et al.

(10) Patent No.: US 9,716,206 B2
(45) Date of Patent: Jul. 25, 2017

(54) INTERCONNECT PROCESSING ASSEMBLY FOR CONNECTING SOLAR CELLS

(71) Applicant: SunPower Corporation, San Jose, CA (US)

(72) Inventors: Thomas Phu, Alameda, CA (US); Shashwat Kumaria, Sunnyvale, CA (US); Briccio deLeon, San Pablo, Laguna (PH)

(73) Assignee: SunPower Corporation, San Jose, CA (US)

( * ) Notice: Subject to any disclaimer, the term of this patent is extended or adjusted under 35 U.S.C. 154(b) by 286 days.

(21) Appl. No.: 14/686,402

(22) Filed: Apr. 14, 2015

(65) Prior Publication Data

US 2015/0287875 A1    Oct. 8, 2015

Related U.S. Application Data

(63) Continuation of application No. 12/978,259, filed on Dec. 23, 2010, now Pat. No. 9,029,689.

(51) Int. Cl.
*H01L 31/18* (2006.01)
*H01L 31/05* (2014.01)

(52) U.S. Cl.
CPC ........ *H01L 31/188* (2013.01); *H01L 31/0508* (2013.01); *Y02E 10/50* (2013.01); *Y10T 29/532* (2015.01)

(58) Field of Classification Search
CPC ... H01L 31/05; H01L 31/0224; H01L 31/188; H01L 31/0508
See application file for complete search history.

(56) References Cited

U.S. PATENT DOCUMENTS

| | | | |
|---|---|---|---|
| 5,113,581 A | 5/1992 | Hidese | |
| 2007/0227627 A1 | 10/2007 | Suh et al. | |
| 2008/0117607 A1* | 5/2008 | Murayama | H01L 21/4846 361/760 |
| 2010/0037932 A1* | 2/2010 | Erez | H01L 31/188 136/244 |

FOREIGN PATENT DOCUMENTS

EP    0 487 336 A2    5/1992

* cited by examiner

*Primary Examiner* — Susan D Leong
(74) *Attorney, Agent, or Firm* — Okamoto & Benedicto LLP

(57) ABSTRACT

A solar cell interconnect processing assembly includes a stack of interconnects, a positioning head, and a control system. The positioning head picks up an interconnect from the stack of interconnects at a first location, moves the interconnect from the first location to a second location, heats the interconnect while moving the interconnect from the first location to the second location, and places the interconnect over two adjacent solar cells at the second location. The control system controls a temperature at which the interconnect is heated and controls movement of the positioning head.

20 Claims, 7 Drawing Sheets

INTERCONNECT PROCESSING ASSEMBLY FOR CONNECTING SOLAR CELLS

CROSS-REFERENCE TO RELATED APPLICATION

This application is a continuation of U.S. patent application Ser. No. 12/978,259, filed Dec. 23, 2010, which is incorporated herein by reference in its entirety.

TECHNICAL FIELD

Embodiments of the subject matter described herein relate generally to techniques for interconnecting solar cells. More particularly, embodiments of the subject matter relate to techniques for handling interconnects for solar cells to reduce fabrication inefficiency.

BACKGROUND

Interconnects are used to electrically couple adjacent solar cells. Because photovoltaic solar cells can be arranged in serial electrical connections, the negative electrical terminals of one solar cell are electrically connected to the positive electrical terminals of a neighboring solar cell. This connection can be made with an electrically-conductive metal piece called an interconnect. Such interconnected photovoltaic solar cells can be later used in a solar panel.

Interconnects are typically joined to one or more electrical terminals of a solar cell with solder. Soldering interconnects to solar cells in a manufacturing environment can require an expensive, multi-step process. Improving the manufacturing efficiency of this step of producing solar panels from individual solar cells can advantageously reduce the cost to produce solar panels.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Figure 1:
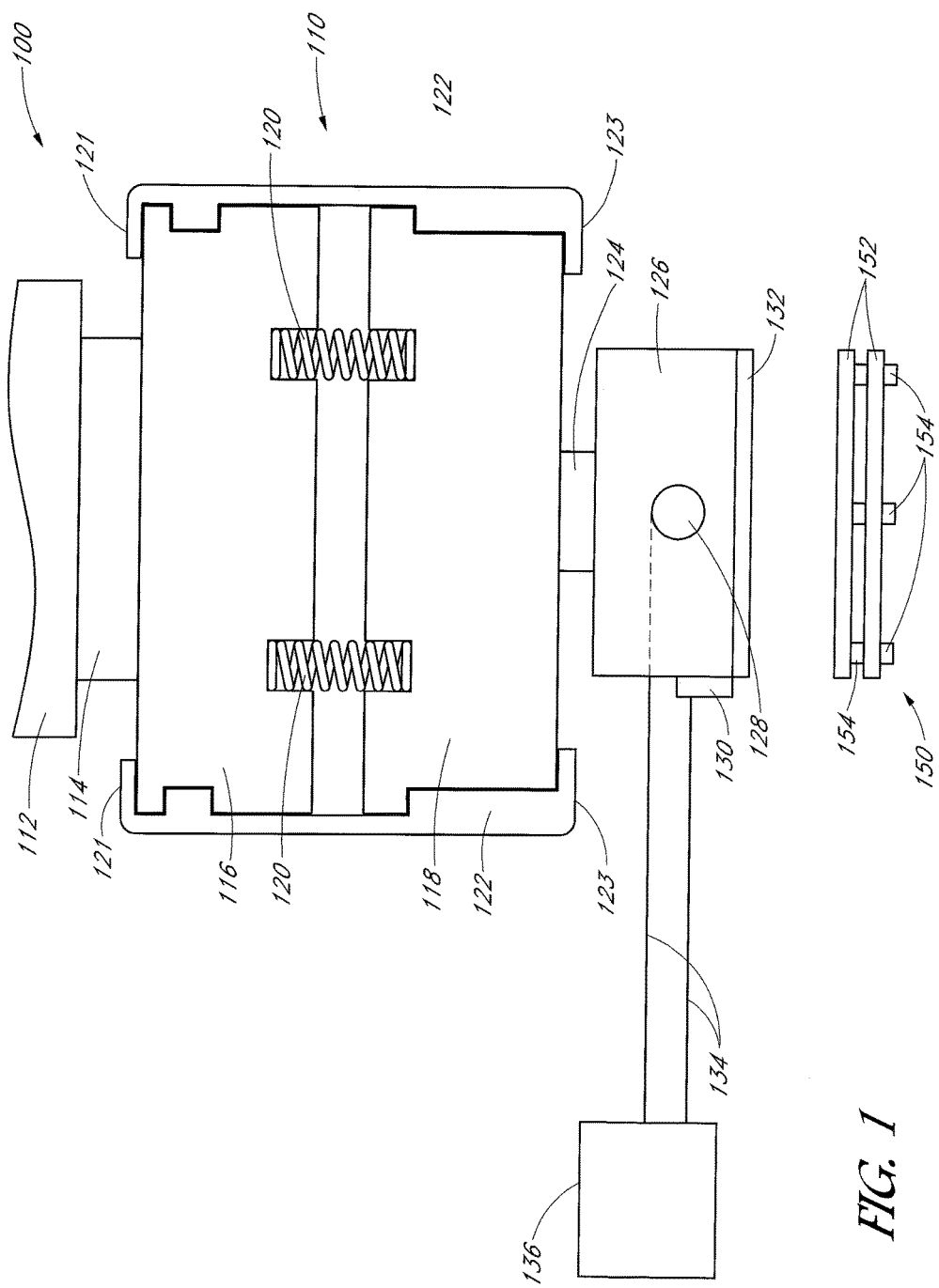
FIG. 1 is a side view of an embodiment of an interconnect processing assembly.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the schematic shown in FIG. 1 depicts one exemplary arrangement of elements, additional intervening elements, devices, features, or components may be present in an embodiment of the depicted subject matter.

"Adjust"—Some elements, components, and/or features are described as being adjustable or adjusted. As used herein, unless expressly stated otherwise, "adjust" means to position, modify, alter, or dispose an element or component or portion thereof as suitable to the circumstance and embodiment. In certain cases, the element or component, or portion thereof, can remain in an unchanged position, state, and/or condition as a result of adjustment, if appropriate or desirable for the embodiment under the circumstances. In some cases, the element or component can be altered, changed, or modified to a new position, state, and/or condition as a result of adjustment, if appropriate or desired.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to internally consistent directions in the drawings to which reference is made. Terms such as "front", "back", "rear", "side", "outboard", and "inboard" may describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

A method of connecting two solar cells is disclosed. The method comprises gripping an interconnect with a head of positioning device, heating the interconnect with the head of the positioning device to between a first predetermined temperature and a second predetermined temperature, where the second predetermined temperature is higher than the first predetermined temperature, positioning the interconnect so as to overlay two adjacent solar cells, coupling the interconnect to each of the two adjacent solar cells, and releasing the interconnect from the head.

A method of coupling two solar cells is also disclosed. The method comprises heating an interconnect with a head of a gripping device, the interconnect comprising a plurality of solder paste preforms, positioning the heated interconnect such that it overlays two solar cells, the solar cells adjacent one another, and pressing the heated interconnect onto the two solar cells.

A method of preparing an interconnect for coupling two solar cells is also disclosed. The method comprises coupling the interconnect to a head of a positioning device, heating the interconnect with the head of the positioning device, adjusting the position of the interconnect by moving the head of the positioning device, and positioning the interconnect against both of the two solar cells.

One technique for coupling solar cells together using an interconnect is to initially deposit a bead of solder paste directly on every location to be electrically connected between the two solar cells. Subsequently, the interconnect can be pressed against the two solar cells, and then moved down the manufacturing line for later heating to complete the solder connection. This type of interconnection technique involves several steps. First, solar cells are positioned in a row near a processing tool at a soldering station. Second, a solder depositing tool places one or more beads of solder on the specific locations on a first solar cell near a first edge. The solder depositing tool then moves to the adjacent second solar cell and deposits solder beads on the specific locations on the second solar cell near a second edge, where the second edge is adjacent the first edge. Third, both solar cells are then moved down the manufacturing line to an interconnect station. Fourth, an interconnect is placed overlaying both solar cells such that the interconnect is soldered to the bus locations by the solder beads. Fifth, both solar cells are again moved down the manufacturing line to the soldering station, where solder connection between each of the cells and the interconnect is completed by further heating the solder beads. A solder bond, electrically connecting the two solar cells is thus formed through the interconnect.

This process requires five discrete steps. It also requires three different tools at two different locations along the manufacturing line, although the tools can be different features of a common machine. A faster, more efficient process, such as one that removes the need for a solder bead dispensing step, would advantageously reduce the complexity of the procedure, thereby reducing the cost of connecting solar cells. One technique which can improve the process is to use an interconnect which has solder preforms affixed to it. The solder preforms can be shaped in any size or shape, and can be positioned at locations which correspond to the bus junctions on adjacent solar cells when the interconnect is placed overlaying the two solar cells.

A challenge in using an interconnect with solder preforms is that the interconnect with such preforms does not inherently adhere to solar cells when placed upon them. This can lead to misalignment during the interval between placing the interconnect and subsequently melting the solder preforms Solder preforms, however, are capable of such adhesion when softened by heating them above a certain temperature, which can vary based on the composition of the solder. Thus, one technique for promoting such adhesion is to heat the solder performs. The heat is necessary to soften or melt the solder preforms, permitting them to solder to the solder pads on each solar cell. Transferring heat to the solder preforms can be accomplished in several ways, but many require additional process steps or heating tools. Additionally, these techniques do not allow precise control over the temperature to which the solder preforms are heated. The temperature can fluctuate during movement of the interconnect, and temperature control is important. If the temperature of the solder preforms is too low, they will not soften enough to enable the desired level of adhesion.

Alternatively, if the temperature of the solder preforms is too high, the solder performs may melt and drip, reducing the available solder material. Moreover, if the interconnect is overheated when heating the solder preforms, the interconnect can expand. After connecting to the solar cells, the interconnect may cool and contract. Because the solder beads and solar cell do not similarly contract, stress can be introduced at the solder locations and transferred to the cells, which can elastically deform the cells, resulting in undesirable physical characteristics of the cell, which can reduce its conversion efficiency.

A technique to reduce the first four steps of the connection process to a single step while controlling the temperature of an interconnect with solder preforms is to embed a heating element in the gripping device which grips, positions, and affixes the interconnect. The operating temperature of the heating element can be controlled using a feedback-driven system. In this way, the temperature of the interconnect can be controlled to an acceptable range which avoids the challenges of under- or over-heating the interconnect.

FIG. 1 illustrates an interconnect processing assembly 100. The assembly 100 comprises a positioning head 110, a control system 136, and a plurality of interconnects 150. Although illustrated for descriptive purposes, the drawings are not to scale and some items may be omitted for clarity. The arrangement shown is representative of the components and may or may not reflect their true positioning relative to one another in some embodiments.

The positioning head 110 can grip, position, and place one of the plurality of interconnects 150 as required to connect solar cells. The positioning head 110 can comprise several components to accomplish different tasks. Some components include a coupling section 114 connecting the rest of the positioning head 110 to a positioning device or mechanism 112. The positioning mechanism 112 can be a mechanical or robotic system for changing the position of the positioning head 110, whether by translation, rotation, or both. The positioning mechanism 112 can be controlled by a control system overseeing one or more aspects of the manufacturing process. The coupling section 114 can be a simple mechanical coupling, such as a fastened, interference fit, affixed, or otherwise coupled as a rigid body for engaging the positioning head 110 to the positioning mechanism 112.

The positioning head 110 can comprise an upper block 116 and a lower block 118 constrained within a frame 122. Helical springs 120 or other compression members can be positioned between the upper block 116 and lower block 118. The upper block 116 can engage the frame 122 such that it is held motionless in both the vertical direction (as illustrated) and horizontal direction. The lower block 118 is similarly constrained by the frame 122 such that it is held motionless in horizontal directions. By contrast to the upper block 116, however, the lower block 118 is constrained by the frame 122 such that it can move upward (toward the upper block 116) in the vertical direction, resisted by the helical springs 120 between the blocks 116, 118. The frame 122 can have lower end clips 123 which limit the separation between the blocks 116, 118. The upper and lower blocks 116, 118 can be composed of a solid block, such as a metal or ceramic prismatic shape. In some embodiments, the blocks 116, 118 can have through-holes and conduits for permitting airflow, wires, or tubes to extend therethrough.

The helical springs 120 can have a stiffness desired for the embodiment to impart a downward force when the upper and lower blocks 116, 118 are compressed toward each other. While the lower block 118 will naturally exert the downward force of its weight against an upward-directed force compressing the blocks 116, 118, the helical springs 120 can provide an increased downward force which can be selected by adjusting the stiffness of the helical springs 120 and the distance between the upper and lower blocks 116, 118 when in a rest position. Hooke's law permits accurate force selection when any compression-resistant elastic member is used, whether helical spring, elastomeric object, or other compression member, such as various types of linear springs. Thus, although helical springs 120 are described, other linear biasing members can be used in other embodiments.

A thermal insulator 124 can be positioned coupled to the lower block 118 through any appropriate technique, such as by fasteners, affixing, bonding, interference fit, such as by screwing the insulator 124 into a corresponding threaded port on the lower block 118, and so on. The thermal insulator 124 can have any thermal conductive property desired for the embodiment, but preferably inhibits flow of heat through itself between the lower block 118 and the heated block 126.

The heated block 126 can be a single component or multiple components, either solid or with cavities therein. The heated block 126 can have a thermal sensor 130 coupled to it, as well as a heating element 128 disposed within, whether as part of a solid block or in one of the cavities. The heated block 126 is preferably made of a metal, such as aluminum, copper, silver, whether elemental, a compound, or an alloy thereof A metal plated block, incorporating several different metals also can be used.

The heated block 126 preferably transfers heat from the heating element 128 to the thermal sensor 130, as well as to its outer surfaces in general. The thermal sensor 130 can be a thermocouple, thermistor, or any other desired sensing device which can determine the temperature of an object to which it is in contact. The heating element 128 can be a resistive heating device of any desired type, size, or kind, or any other device as desired for the embodiment to perform the functions described below.

The heated block 126 can be coupled to a carriage 132. The carriage 132 can be attached to the heated block 126 using any of the techniques described above for coupling components of the positioning head 110 together. The carriage 132 can be a gripping mechanism, such as with electro-mechanical grasping elements, a vacuum interface for holding an object against itself, where conduits for evacuating air can pass through or around the heated block 126 and the other components of the heated block 126, or any other gripping, grasping, or releaseably coupling devices or techniques.

The carriage 132 can be thermally connected to the heated block 126, including as an integrated component of the heated block 126. Thus, heat generated by the heating element 128 can be easily transferred to and through the carriage 132, as opposed to the heat transfer inhibition which occurs at the thermal insulator 124. In certain embodiments, thermal paths, such as a metal with superior thermal conductivity to the surrounding material, can be positioned to transfer heat from the heating element 128 to the carriage 132, thereby at least partially insulating the remainder of the heated block 126. In some embodiments, the thermal paths can extend through the carriage 132 to its gripping surface which interfaces with an interconnect.

The heating element 128 and thermal sensor 130 can be connected to a control device 136 through wires 134. The control device 136 can be responsible for various functions in addition to services performed with respect to the heating element 128 and the thermal sensor 130. For example, in some embodiments, the control device 136 can be the master control system which operates one or more features of the positioning head 110, positioning mechanism 112, movement of solar cells in the assembly 100, or other operations. In certain embodiments, the control device 136 can interface solely with the heating element 128 and thermal sensor 130. In other embodiments, the heating element 128 and thermal sensor 130 can be controlled by or connected to different control systems, which may or may not interoperate directly.

The heating element 128 can be selected to produce enough heat to raise the temperature of the surrounding and/or contacting heated block 126 to any desired temperature. For example, the heating element 128 can be capable of producing enough heat to maintain the heated block 126 at a temperature of 120° C., or greater, up to 150° C., if desired. Similarly, the heating element 128 can be controllable to produce a lesser temperature, such as 40° C. 80°, C. or 100° C., if desired. The heating element 128 can be controllable by the control device 136 to produce any desired temperature.

The thermal sensor 130 can be used to determine the temperature of the heated block 126 at its location of detection. The thermal sensor 130 can provide a signal to the control device 136 which is indicative of the temperature of the heated block 126. The signal from the thermal sensor 130 can be a voltage which is interpreted by control device 136 to determine the temperature measured by the thermal sensor 130. Or, in some embodiments, the signal can be a transmission a temperature value, where the thermal sensor 130 performs any and all computation or measurement operations to determine the temperature from a voltage or resistance measurement.

Thus, the control device 136 can operate the heating element 128 with feedback from the thermal sensor 130 to maintain a desired temperature of the heated block 126. In those embodiments where the carriage 132 is integrated with the heated block 126, the carriage is maintained at the desired temperature as well. In certain embodiments, the thermal sensor 130 can determine the temperature of the carriage 132, rather than the heated block 126, by being coupled directly to the carriage 132. In some embodiments, more than one thermal sensor can be used with the same or different components. In some embodiments, the temperature of the heated block 126 can be maintained between a lower predetermined temperature and an upper predetermined temperature. The predetermined temperatures can correspond to any selected from the range between 50° and 120° C., such as a lower temperature of 60° C. and an upper temperature of 100° C.

Figure 2:
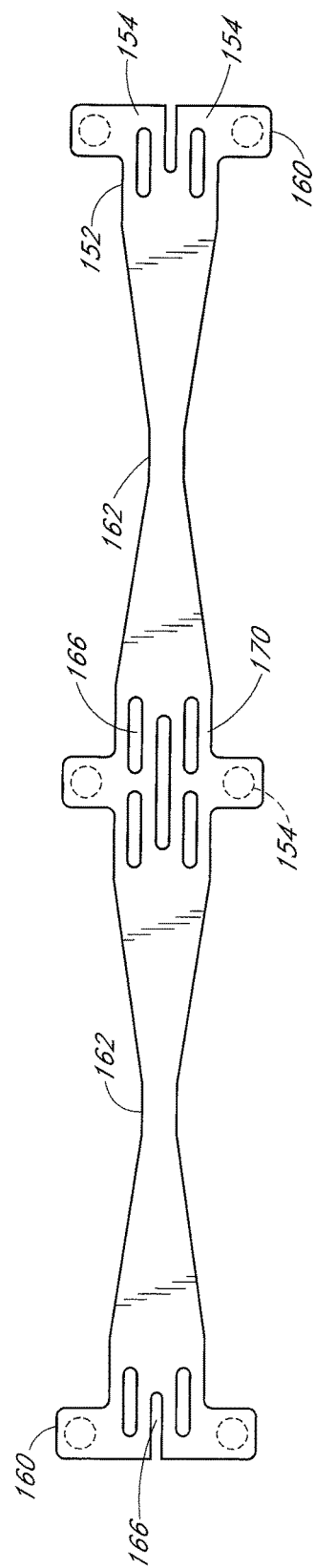
FIG. 2 is a top view of an embodiment of an interconnect for solar cells.

A stack of interconnects 150 can be located near the positioning device 112. Each interconnect 152 can have one or more solder beads preformed, or solder preforms 154 affixed to it. Although illustrated as vertically stacked, in some embodiments, the plurality of interconnects can be formed as a ribbon or sheet, and punched apart prior to connection to solar cells. FIG. 2 illustrates a top view of an exemplary interconnect 152. The interconnect 152 can be composed of an electrically-conductive metal, such as copper, silver, or gold, whether elemental or a compound or alloy thereof.

Each embodiment of an interconnect 152 can have a different shape. One example embodiment is illustrated with a central region 170, two extension members 162, and edge regions 160. The interconnect 152 can have one or more stress relief regions 166, such as the oblong or ovoid ports shown. The size and shape and positioning of the stress relief regions 166 can vary between embodiments. The interconnect 152 is sufficiently sized and shaped to overlay and connect all bus junctions of solar cells, as described below. The particular shape can vary between embodiments to match the geometry of bus junctions on solar cells. As used herein, bus junctions and bus terminals are used interchangeably to refer to pads or regions of location on a solar cell where common electrical connection is made among several bus bars.

In certain embodiments, including the illustrated embodiment, the interconnect 152 can connect to six bus junction locations, three on each of two solar cells. In other embodiments, however, more or fewer bus junctions can be joined by an interconnect, resulting in variations in the size and shape. Thus, other embodiments of interconnects can be used in the techniques described herein.

The solder preforms 154 can be manufactured with each interconnect 152 on the underside of the interconnect 152. The solder preforms 154 can be positioned at appropriate locations to align with the bus junctions of solar cells being connected with the interconnect 152. Each solder preform 154 preferably has a solid state at room temperature or in the ambient temperature of the manufacturing environment. The preforms 154 can be composed of a tin, silver, zinc, or other desired materials to form a solder bead. A flux or adhesive can be included in each preform 154 to assist with coupling to the interconnect 152 during manufacture. In the illustrated embodiment, six solder preforms 154 are present to correspond to three bus junctions on each of two adjacent solar cells. One preform 154 is located near opposite edges of the central region 170, and two preforms 154 are also located on each of the edge regions 160, again one preform 154 near either edge of the interconnect 152. As described, the number and location of the preforms 154 can vary between embodiments. The preforms 154 are illustrated as having a circular shape, although any other desired shape or size can be used, such as rectangular, irregular, and so on.

Figure 3:
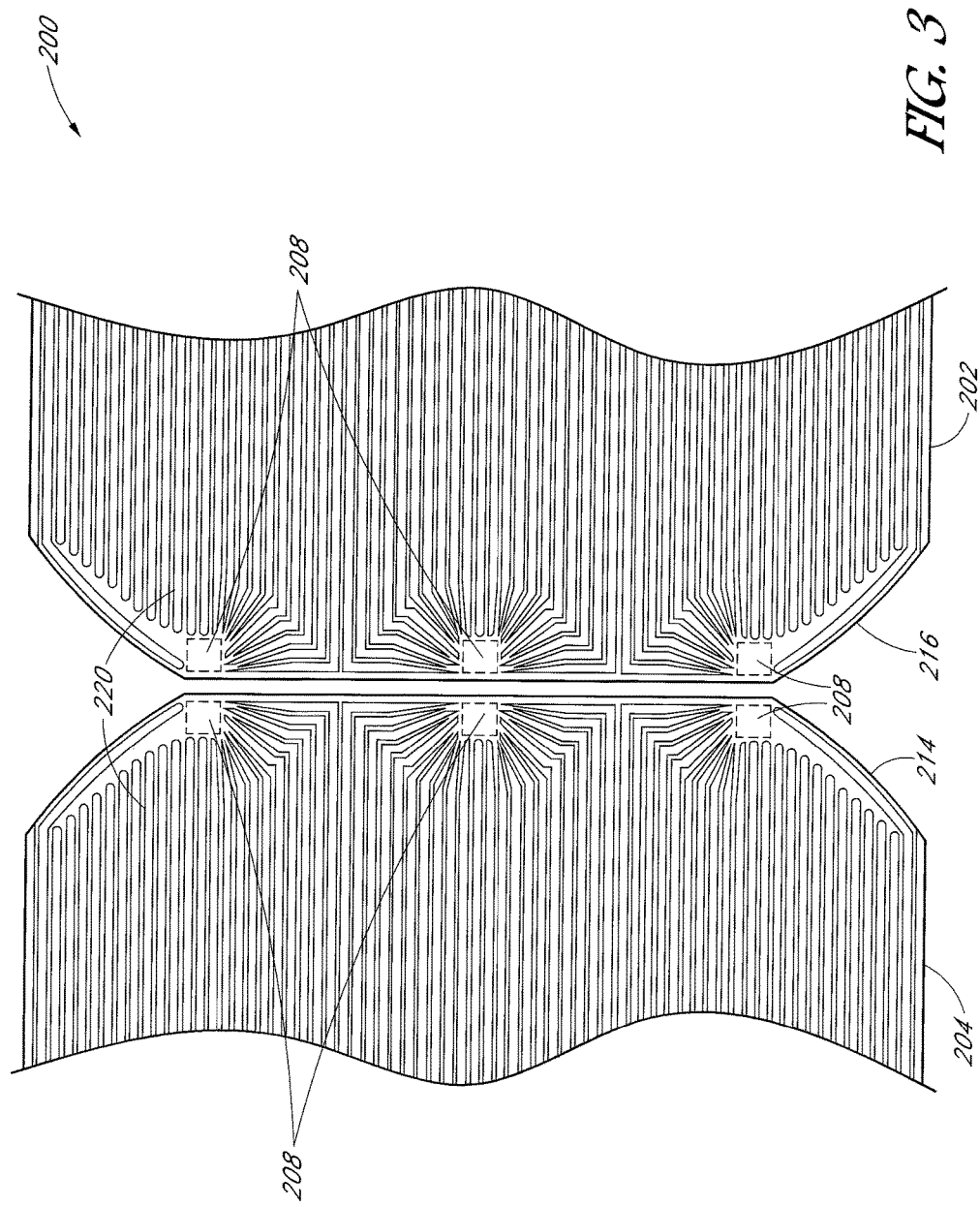
FIG. 3 is a top view of two adjacent solar cells.

FIG. 3 illustrates two adjacent solar cells 200, namely a first cell 204 and second cell 202. The solar cells 204, 202 can be photovoltaic solar cells, whether mono- or polycrystalline silicon, front or back contact cells, or front or back junction cells. Back contact photovoltaic solar cells 204, 202 are shown for the exemplary embodiment, and accordingly, the interconnects used are coupled to the back surface of the solar cells, but the techniques described herein can be applied to interconnects to the front side of photovoltaic solar cells as well.

The first cell 204 has a first edge 214 near a second edge 206 of the second cell 202. The cells 204, 202 can have rounded or cambered corners, or alternatively, square corners. Each solar cell 204, 202 can have a plurality of bus bars 220 which terminate in a solder pad or bus junction 208. The bus bars 220 can have a layout or design as shown or, alternatively, can be substantially parallel over the surface of the cell, where a common bus bar can extend in a perpendicular direction to the parallel bus bars connecting the bus junctions. The bus junctions or bus terminals can be located near, proximate to, or adjacent an edge of the solar cell containing them. In certain embodiments, the bus junctions are collinear, while in other embodiments, they may be offset from one another, relative to the edge of the solar cell.

Regardless of the chosen layout, the bus bars 220 can transmit electrical current to the bus junctions 208. It is desirable to couple the bus junctions from the first cell 204 to the bus junctions 208 of the second cell 202. In this way, the cells 204, 202 can be connected serially, permitting efficient power generation.

Figure 4:
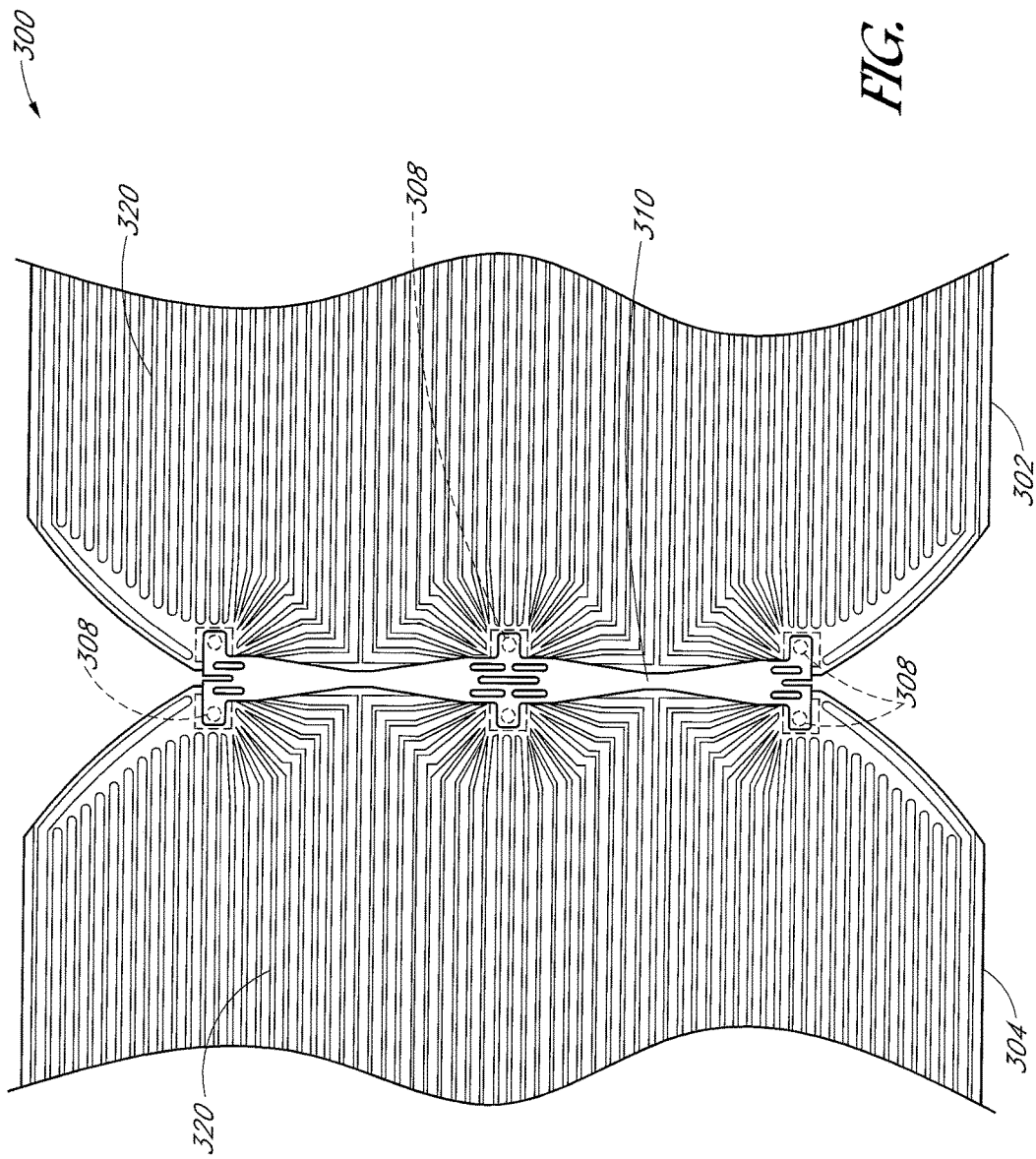
FIG. 4 is a top view of two adjacent solar cells joined by an embodiment of an interconnect.

FIG. 4 illustrates an interconnected pair of solar cells 300. Unless otherwise indicated, the components of FIG. 4 are similar to those of FIG. 3, and numerical indicators refer to similar components, except that the number of the indicator has been incremented by 100. Additionally, reference to the interconnect 310 is made similar to the interconnect described above with respect to FIGS. 1 and 2.

And interconnect 310 has been overlaid to the first and second cells 304, 302 such that the solder preforms of the interconnect are positioned to electrically connect to each of the bus junctions 308 of the solar cells 304, 302. The solder preforms can be pressed against, coupled to, or applied to the bus junctions 308 when heated to a melted or softened state, permitting adhesion between the bus junctions 308 and the interconnect 310. As used herein, soften refers to a change in state of the solder from a solid state to one in which it is sticky or tacky, and capable of affixing to another surface due to the flux in the solder preform, which can be an organic compound.

Electrical current generated by the first solar cell 304 can now flow through its bus junctions 308, through the interconnect 310, and into the bus junctions 308 of the second cell 302. In this way, the solar cells 304, 302 are serially connected.

Figure 5:
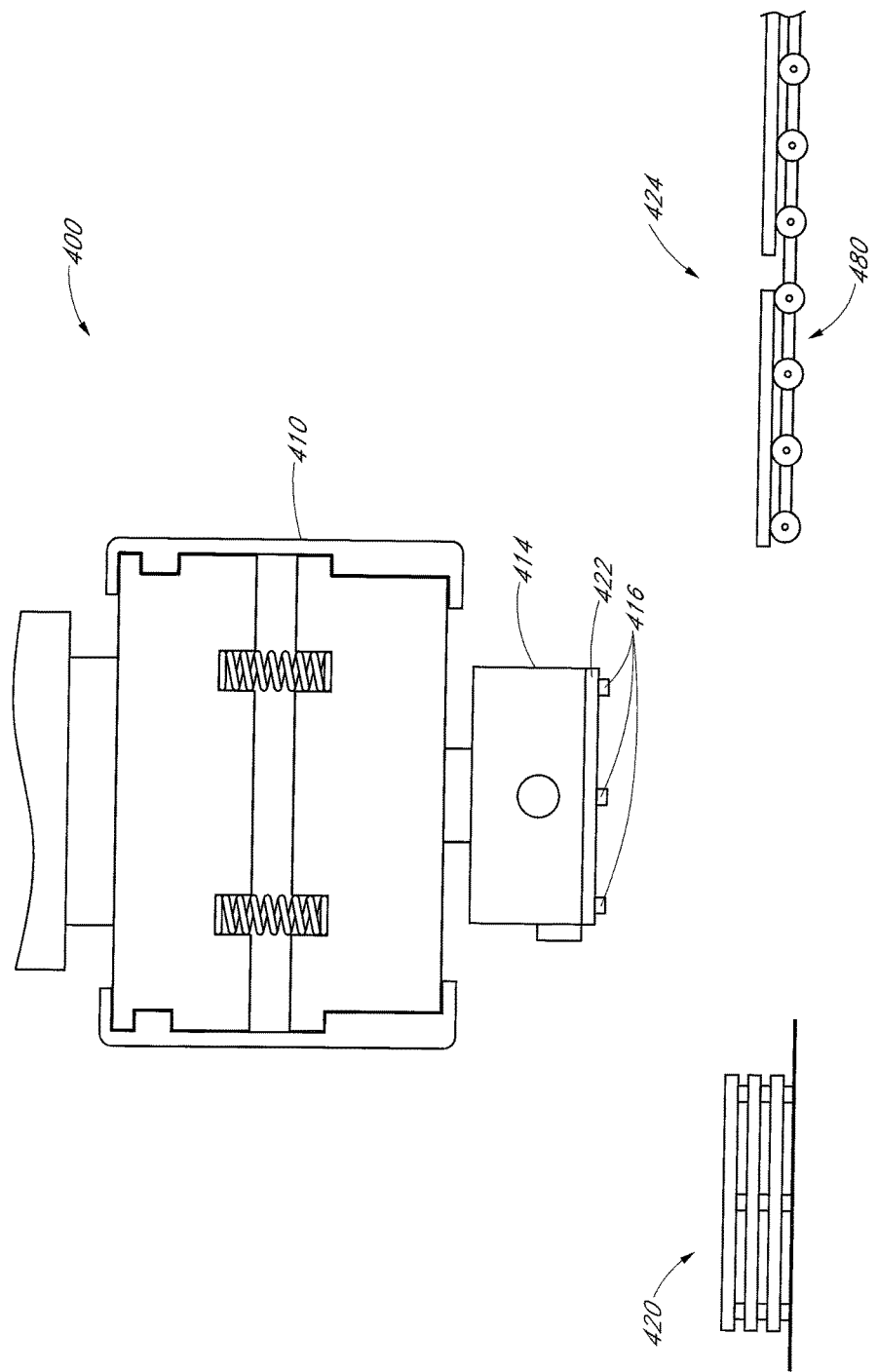
FIG. 5 is a side view of an embodiment of an interconnect processing assembly.
Figure 6:
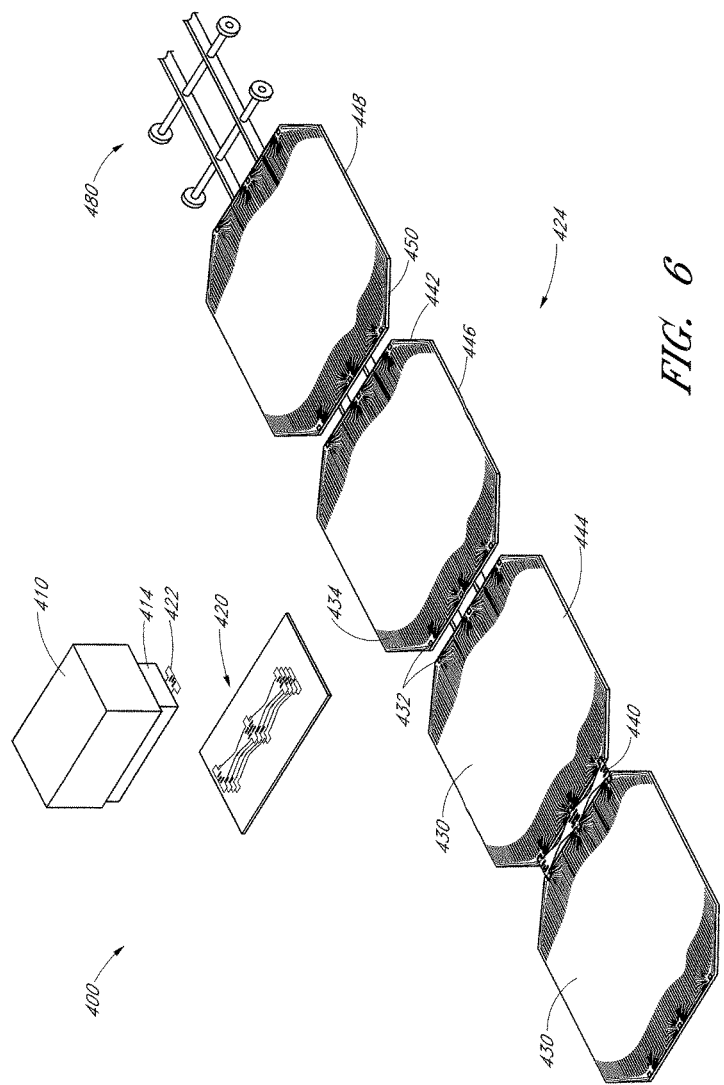
FIG. 6 is a perspective view of the interconnect processing assembly of FIG. 5.

FIGS. 5 and 6 illustrate an exemplary manufacturing arrangement 400, where certain components are simplified or omitted for ease of explanation. For example, the positioning mechanism which controls the position and/or orientation of the positioning head 410 is omitted, and the upper and lower blocks are shown as the positioning head 410, rather than as separate units, which can be true in some embodiments, while they can be separate components in other embodiments.

The positioning head 410 can adjust the position of the heated block 414. The heated block 414 can grip a interconnect 422 having a plurality of solder preforms 416 at desired locations. A stack of interconnects 420 can be positioned near a plurality of solar cells 424. The solar cells 424 can be supported by a conveyance mechanism 480, such as a tray, chuck, belt, line, or other device suitable for moving the solar cells 424 in a linear motion. Two connected solar cells 430 are shown with a soldered interconnect 440.

The positioning head 410 can move the heated block 414 to the stack of interconnects 420. The heated block 414 can be continuously heated to between 80 and 100° C. by the internal heating element, where the selected temperature is maintained through use of a control system relying on feedback from a thermal sensor coupled to the heated block 414. The heated block 414 can then be moved downward to grip the top interconnect 422 from the stack 420. This gripping can be achieved by vacuum, drawing the interconnect 422 against the heated block 414, or by a mechanical grasping, or any other desired interaction.

The heated block 414 can be heated to a sufficient temperature to soften the solder preforms 416 on the interconnect 422. In some embodiments, the interconnects 422 can be constructed such that heat is transferred from the heated block 414 to the solder preforms 416 in less than a second when surrounded by the ambient atmosphere. Accordingly, there need not be a delay step to permit heat to be transferred to the solder preforms 416. In certain embodiments, the positioning head 410 can be controlled to move at a speed which permits heat transfer from the heated block 414 through the interconnect 422 and into the solder preforms 416.

After gripping the interconnect 422, the positioning head 410 can move to position the interconnect 422 overlaying two solar cells, such as between solar cells 444, 446. Each connected solar cell can have two interconnects coupled to it, one on either side, forming a string. Boundary solar cells, those at either end of a selected number in a string, will not have adjacent solar cells and instead can be coupled to a bus bar or other mechanism for transferring electrical current.

The interconnect 422 can be positioned above and overlaying the adjacent solar cells 444, 446 such that the solder preforms 416 overlay the bus junctions 432 near the terminal ends of bus bars 434. The positioning head 410 can then press the interconnect 422 against the adjacent solar cells 444, 446 to affix the solder preforms 416 to the bus junctions 432, thereby physically connecting them. Although in some embodiments, an electrical connection can also be established by such contact, in those preforms having a relatively high organic flux composition, further heating may be necessary to produce the desired electrical conductivity between the cells 444, 446 and the interconnect 422. The resulting connection is similar to that of FIG. 4. When pressing the interconnect 422 against the solar cells 444, 446, the upper and lower blocks of the positioning head 410 can be compressed together, as resisted by helical springs or other linear elastic members. The spring resistance can, as described above, be determined for the embodiment and, therefore, the force used to apply the interconnect 422 against the solar cells 444, 446 selected as desired. In one embodiment, contact sensors between the upper and lower blocks can be used to determine when the blocks meet, and the maximum force from the springs has been reached.

Once the interconnect 422 has been deposited against the solar cells 444, 446, the positioning head 410 can release it, and raise, moving to the stack of interconnects 420 to grip the next interconnect on the stack 420. The conveyance mechanism 480 can then operate to move the connected solar cells to the next position, and bring the other edge 442 of the second cell 446 and the first edge 450 of the next cell 448 into position to receive an interconnect, continuing the manufacturing process. Subsequently, the interconnect which has been placed during this manufacturing process can be heated, such as by an induction heating device, to further treat the solder and increase the stability of the electrical connection between the cells.

Figure 7:
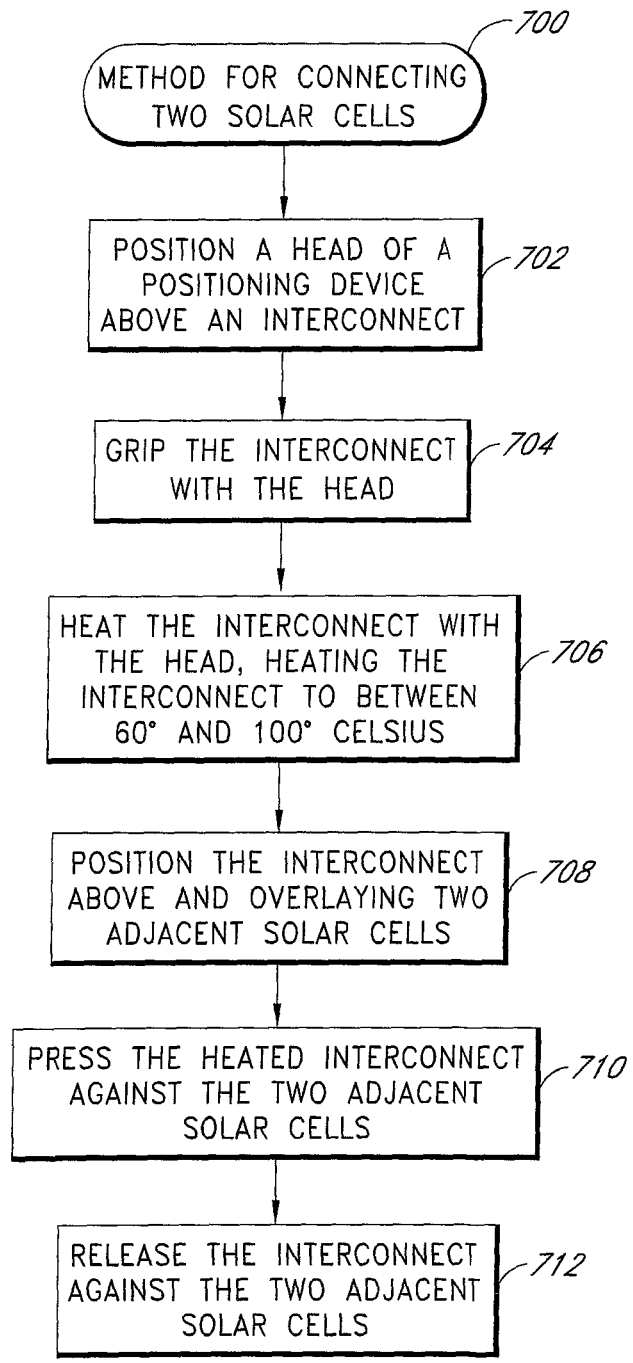
FIG. 7 is a flowchart diagram of a method of interconnecting adjacent solar cells.

FIG. 7 is a schematic representation of an embodiment of a method, technique, and process for connecting solar cells. The various tasks performed in connection with method 700 may be performed by software, hardware, firmware, or any combination thereof For illustrative purposes, the following description of method 700 may refer to elements mentioned above in connection with FIGS. 1-6. In practice, portions of method 700 may be performed by different elements of the described system, e.g., positioning head 110, control device 136, or heating element 128. It should be appreciated that method 700 may include any number of additional or alternative tasks, the tasks shown in FIG. 7 need not be performed in the illustrated order, and method 700 may be incorporated into a more comprehensive procedure or process having additional functionality not described in detail herein. As used herein, reference to a positioning head can include description of the head of an positioning device, such as a robotic device.

Two solar cells can be positioned adjacent each other along a stringing line. In certain embodiments, the solar cells can be on a conveyance device, such as a roller rack, moving belt, and so on. A head of a positioning device can be moved 702 to be positioned above an interconnect. The interconnect can have solder preforms affixed to its underside. The interconnect can be one of a plurality of interconnects stacked or ribboned for ease of manufacturing. Although described as being positioned above, it should be understood that the direction is relative, and the interconnects can be stacked sideways and gripped by a positioning head to the side of the interconnect.

The positioning head can then grip 704 the interconnect using any desired technique, including vacuum suction. As part of the gripping step, the positioning head can move toward the interconnect from its earlier position to contact the interconnect. The interconnect can then be heated 706 by the positioning head. For example, the positioning head can be heated by an internal thermal device such as a resistive heating element and, in turn, conduct heat to the gripped interconnect. The interconnect can be heated to between 60 and 100° C., depending on the embodiment. In one embodiment, a thermal sensor can be coupled to the positioning head to provide feedback to a control device operating an internal thermal device. The control device can operate the internal thermal device to maintain a temperature of 100° C. The interconnect can receive heat from the positioning device and transfer that heat to the solder preforms, resulting in a softening or melting of the solder. In another embodiment, heating the interconnect with the positioning head can result not from heating the head and conducting heat to the interconnect, but by gripping the interconnect with an unheated positioning head and heating the interconnect directly using an infra-red source. In at least one embodiment, the infra-red source can be disposed in or attached to the positioning head. In other embodiments, the infra-red source can be remote to the positioning head.

The positioning head can then position 708 the interconnect it is gripping above two adjacent solar cells such that the interconnect overlays both solar cells. In some embodiments, the positioning head can position the interconnect such that the solder preforms are positioned above and corresponding to locations of bus junctions on each of the solar cells. The positioning head can then advance toward the adjacent solar cells and press 710 the interconnect with the heated solder preforms to the two solar cells. The solder preforms can then be affixed to the bus junctions. The positioning head can then release 712 the interconnect and, in some embodiments, the positioning head can be returned to the initial position above the next interconnect in the stack of interconnects. The interconnect pressed against the adjacent solar cells, whether later heated during continued processing or left as-is, will cool, which includes cooling of the solder preforms, resulting in a mechanical connection between the two solar cells and the interconnect which does not produce undesirable physical characteristics in the solar cells, such as bowing of the cells.

As a result of combining a solder heating step with the interconnect placement step, the interconnect can be placed against the solar cells such that misalignment during manufacturing is inhibited. Thus, manufacturing efficiency is improved. The solder preforms are heated to predetermined temperatures through the advantageous use of a heated positioning head, where the temperature of the head is controlled by a feedback system. The manufacturing costs are thereby advantageously reduced.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A solar cell interconnect processing assembly comprising:
   a positioning head configured to: grip an interconnect, move the interconnect from a first location to a second location, heat the interconnect while moving the interconnect from the first location to the second location, and place the interconnect over two adjacent solar cells at the second location; and
   a control system configured to control movement of the positioning head from the first location to the second location.

2. The solar cell interconnect processing assembly of claim 1, wherein the positioning head comprises a heated block configured to heat the interconnect.

3. The solar cell interconnect processing assembly of claim 2, wherein the positioning head further comprises a thermal sensor coupled to the heated block, and wherein the control system is configured to control a temperature at which the interconnect is heated while being moved from the first location to the second location based on a feedback signal from the thermal sensor.

4. The solar cell interconnect processing assembly of claim 2, wherein the heated block is mechanically and thermally coupled to a carriage configured to hold the interconnect while the interconnect is heated and moved from the first location to the second location.

5. The solar cell interconnect processing assembly of claim 4, wherein the carriage comprises a vacuum interface.

6. The solar cell interconnect processing assembly of claim 4, wherein the carriage comprises an electro-mechanical grasping element.

7. The solar cell interconnect processing assembly of claim 1, wherein the control system is configured to control a temperature at which the interconnect is heated while being moved from the first location to the second location.

8. A solar cell interconnect processing assembly comprising:
   a plurality of interconnects at a first location; and
   a positioning head configured to: pick up an interconnect from the plurality of interconnects at the first location, move the interconnect from the first location to a second location, heat the interconnect while moving the interconnect from the first location to the second location, and press the interconnect over two adjacent solar cells at the second location.

9. The solar cell interconnect processing assembly of claim 8, further comprising:
   a control system configured to control movement of the positioning head from the first location to the second location.

10. The solar cell interconnect processing assembly of claim 9, wherein the control system is configured to control a temperature at which the interconnect is heated in transit from the first location to the second location.

11. The solar cell interconnect processing assembly of claim 8, wherein the positioning head comprises a heated block configured to heat the interconnect.

12. The solar cell interconnect processing assembly of claim 11, wherein the positioning head further comprises a thermal sensor coupled to the heated block, and wherein the control system is configured to control the temperature at which the interconnect is heated while being moved from the first location to the second location based on a feedback signal from the thermal sensor.

13. The solar cell interconnect processing assembly of claim 8, wherein the heated block is mechanically and thermally coupled to a carriage configured to hold the interconnect while the interconnect is heated and moved from the first location to the second location.

14. The solar cell interconnect processing assembly of claim 13, wherein the carriage comprises a vacuum interface.

15. The solar cell interconnect processing assembly of claim 13, wherein the carriage comprises an electro-mechanical grasping element.

16. A solar cell interconnect processing assembly comprising:
   a positioning head configured to: pick up an interconnect from a plurality of interconnects at a first location, move the interconnect from the first location to a second location, heat the interconnect while moving the interconnect from the first location to the second location, and place the interconnect over two adjacent solar cells at the second location; and
   a control system configured to control a temperature at which the interconnect is heated by the positioning head in transit from the first location to the second location.

17. The solar cell interconnect processing assembly of claim 16, wherein the positioning head comprises a heated block configured to heat the interconnect.

18. The solar cell interconnect processing assembly of claim 17, wherein the positioning head further comprises a thermal sensor coupled to the heated block, and wherein the control system is configured to control the temperature at which the interconnect is heated while being moved from the first location to the second location based on a feedback signal from the thermal sensor.

19. The solar cell interconnect processing assembly of claim 16, wherein the heated block is mechanically and thermally coupled to a carriage configured to hold the interconnect while the interconnect is heated and moved from the first location to the second location.

20. The solar cell interconnect processing assembly of claim 16, wherein the control system is configured to control movement of the positioning head from the first location to the second location.

* * * * *